United States Patent
Wiegner et al.

(10) Patent No.: US 12,328,156 B2
(45) Date of Patent: Jun. 10, 2025

(54) APPARATUS COMPRISING A TRANSMISSION LINE FOR RADIO FREQUENCY SIGNALS

(71) Applicant: Nokia Solutions and Networks Oy, Espoo (FI)

(72) Inventors: Dirk Wiegner, Schwaikheim (DE); Wolfgang Templ, Sersheim (DE); Senad Bulja, Dublin (IE); Rose Kopf, Green Brook, NJ (US)

(73) Assignee: Nokia Solutions & Networks Oy, Espoo (FI)

( * ) Notice: Subject to any disclaimer, the term of this patent is extended or adjusted under 35 U.S.C. 154(b) by 510 days.

(21) Appl. No.: 17/796,000

(22) PCT Filed: Jan. 22, 2021

(86) PCT No.: PCT/IB2021/050497
§ 371 (c)(1),
(2) Date: Jul. 28, 2022

(87) PCT Pub. No.: WO2021/152438
PCT Pub. Date: Aug. 5, 2021

(65) Prior Publication Data
US 2023/0055602 A1    Feb. 23, 2023

(30) Foreign Application Priority Data
Jan. 30, 2020   (EP) .................................... 20154674

(51) Int. Cl.
*H04B 3/50*       (2006.01)
*H01P 3/16*       (2006.01)
(Continued)

(52) U.S. Cl.
CPC ................. *H04B 3/50* (2013.01); *H01P 3/16* (2013.01); *H03F 1/0272* (2013.01); *H03F 1/56* (2013.01);
(Continued)

(58) Field of Classification Search
CPC . H04B 3/50; H03F 3/601; H03F 3/245; H03F 3/193; H03F 7/00–04;
(Continued)

(56) References Cited

U.S. PATENT DOCUMENTS

2004/0198271 A1   10/2004   Kang
2006/0132885 A1*   6/2006   Pichot ..................... G02F 1/155
                                                            359/265

(Continued)

FOREIGN PATENT DOCUMENTS

| | | |
|---|---|---|
| CN | 107112953 A | 8/2017 |
| EP | 2575211 B1 | 11/2014 |
| EP | 2956986 B1 | 2/2017 |

OTHER PUBLICATIONS

Oliveri, Giacomo et al., "Reconfigurable Electromagnetics Through Metamaterials—A Review", Proceedings of the IEEE, vol. 103, No. 7, Jul. 2015, New York.

*Primary Examiner* — Ronald Eisner
(74) *Attorney, Agent, or Firm* — McCarter & English LLP

(57) ABSTRACT

Apparatus including a first transmission line for transmitting radio frequency, RF, signals and at least one RF device including at least one active semiconductor device for processing RF signals, wherein said at least one RF device is coupled to said first transmission line, and wherein said first transmission line includes an electro-chromic, EC, material a permittivity of which can be controlled by applying a first control voltage to said first transmission line.

15 Claims, 5 Drawing Sheets

(51) Int. Cl.
*H03F 1/02* (2006.01)
*H03F 1/56* (2006.01)
*H03F 3/24* (2006.01)
*H03F 3/60* (2006.01)

(52) U.S. Cl.
CPC ............ *H03F 3/245* (2013.01); *H03F 3/601* (2013.01); *H03F 2200/423* (2013.01); *H03F 2200/451* (2013.01)

(58) Field of Classification Search
CPC ......... H03F 2200/423; H03F 2200/387; H03F 2200/255; H03F 2200/222; H03F 1/56; H03F 1/0272; H03F 2200/207–451; H01G 7/06; H01P 3/16
See application file for complete search history.

(56) References Cited

U.S. PATENT DOCUMENTS

2017/0327476 A1* 11/2017 Cho ................. C08G 14/14
2019/0103644 A1* 4/2019 Jakoby ................ H01P 1/181

* cited by examiner

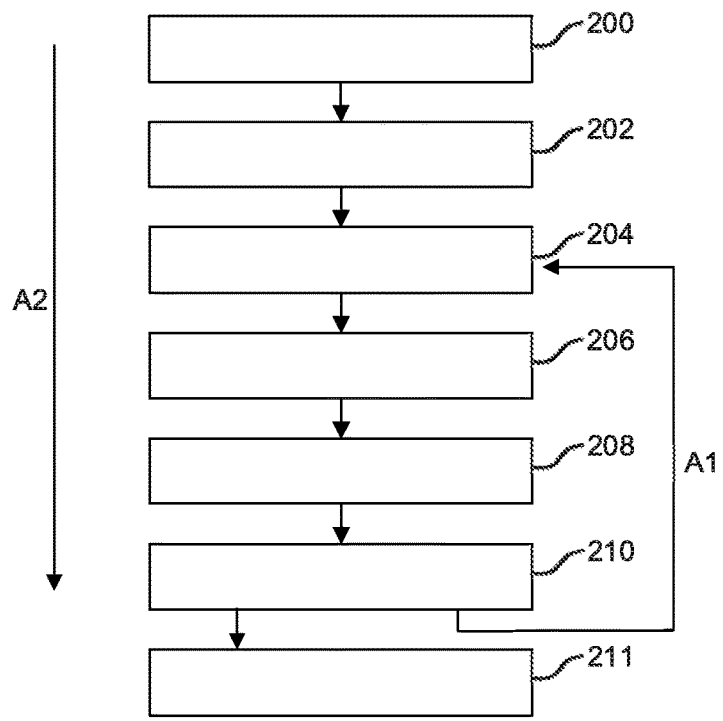
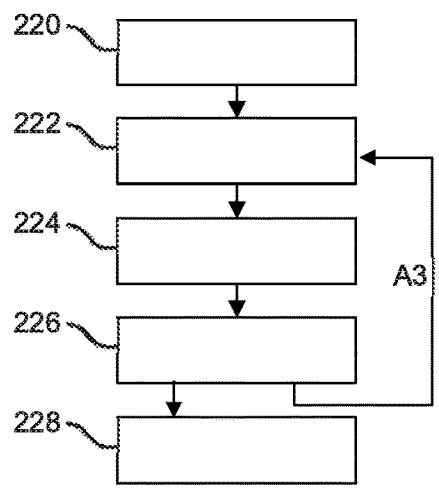
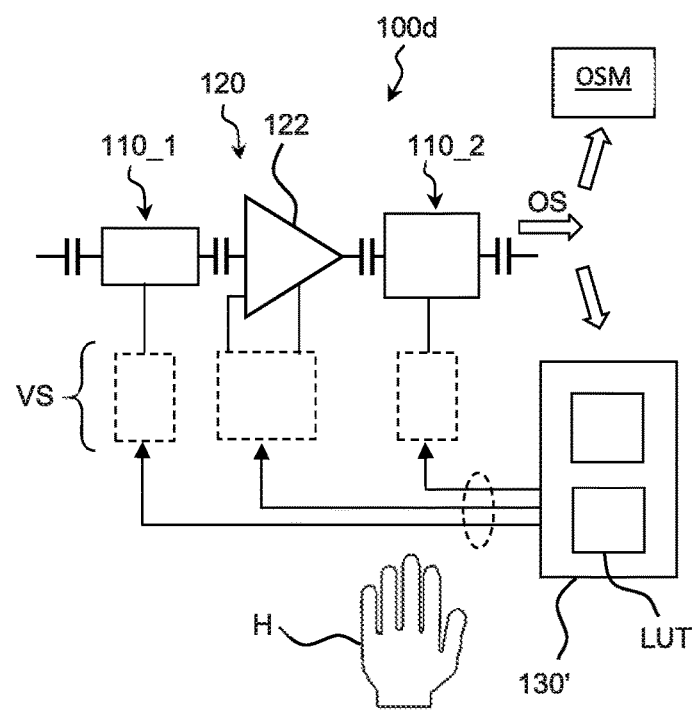

APPARATUS COMPRISING A TRANSMISSION LINE FOR RADIO FREQUENCY SIGNALS

CROSS REFERENCE TO RELATED APPLICATION

This patent application is a U.S. National Stage application of International Patent Application Number PCT/IB2021/050497 filed Jan. 22, 2021, which is hereby incorporated by reference in its entirety, and claims priority to EP 20154674.4 filed Jan. 30, 2020.

FIELD OF THE DISCLOSURE

Exemplary embodiments relate to an apparatus for transmitting radio frequency, RF, signals.

Further exemplary embodiments relate to a method of manufacturing such apparatus.

Further exemplary embodiments relate to a method of operating such apparatus.

Further exemplary embodiments relate to a use of the abovementioned apparatus and/or method(s).

BACKGROUND

Apparatus of the aforementioned type can be used to process radio frequency, RF, signals, e.g. for radio devices for cellular communications systems.

SUMMARY

The scope of protection sought for various embodiments of the disclosure is set out by the independent claims. The exemplary embodiments and features, if any, described in this specification, that do not fall under the scope of the independent claims, are to be interpreted as examples useful for understanding various exemplary embodiments of the disclosure.

Exemplary embodiments relate to an apparatus comprising a first transmission line for transmitting radio frequency, RF, signals and an RF device comprising at least one active semiconductor device for processing RF signals, wherein said RF device is coupled to said first transmission line, and wherein said first transmission line comprises an electro-chromic, EC, material a permittivity of which is controllable by applying a first control voltage to said first transmission line. This enables to effect a change of electric characteristics of the first transmission line such as e.g. the characteristic impedance of said first transmission line, e.g. by altering the first control voltage.

According to further exemplary embodiments, said first control voltage may also be changed dynamically, i.e. during operation of said apparatus and/or its RF device, respectively, so that the characteristic impedance of the first transmission line may also be altered dynamically. According to further exemplary embodiments, this enables tuning of said characteristic impedance of the first transmission line thus e.g. compensating ageing effects and/or manufacturing tolerances and/or allows to optimize apparatus performance (e.g. energy efficiency) during operation such as e.g. load dependent optimization.

According to further exemplary embodiments, said EC material is a material which allows its optical and/or electrical properties to be controlled by applying a voltage.

According to further exemplary embodiments, the first transmission line may e.g. be used to effect an impedance transformation of said RF device. In other words, the first transmission line may be used as an impedance transformer. Advantageously, by altering the control voltage applied to the EC material of said first transmission line, the degree of impedance transformation effected by said first transmission line may be controlled. This way, a dynamically (i.e., during operating time) tuneable impedance transformer may be provided, e.g. enabling matching an impedance of said RF device to another device, which may e.g. also be coupled to said first transmission line.

According to further exemplary embodiments, said RF device may comprise or is at least one of: a) an amplifier, e.g. a power amplifier, PA, or a low noise amplifier, LNA, b) a transmitter, c) a receiver, d) a transceiver.

According to further exemplary embodiments, said amplifier may comprise at least one of the following types: a) Class-A, b) Class-B, c) Class-C, d) Class-D, e) push-pull amplifier, f) Doherty amplifier, g) LINC (Linear Amplification using Nonlinear Components) amplifier, h) Envelope Tracking amplifier, i) single- or wideband amplifier, etc.

According to further exemplary embodiments, said RF signals may e.g. be in the cm-wave range and/or in the mm-wave range, etc.

According to further exemplary embodiments, said first transmission line may transmit a first RF signal to said RF device, and said RF device may be configured to process said first RF signal. Such exemplary configuration may e.g. be used for supplying an amplifier or a transmitter with an RF signal to be transmitted via an air interface.

According to further exemplary embodiments, said RF device may comprise a transceiver or receiver for receiving a second RF signal, e.g. via an air interface, and said RF device may provide said received (i.e., second) RF signal or a further (RF) signal derived from said received RF signal to said first transmission line.

According to further exemplary embodiments, said at least one active semiconductor device is a transistor, e.g. RF transistor. According to further exemplary embodiments, said at least one active semiconductor device may comprise a plurality of electric and/or electronic elements, wherein one or more transistors, particularly RF transistors, may be provided. According to further exemplary embodiments, using the tuneable first transmission line, impedance matching between the RF device and the first transmission line may be effected.

According to further exemplary embodiments, said apparatus comprises at least one further transmission line that comprises an electro-chromic, EC, material a permittivity of which can be controlled by applying a further control voltage to said at least one further transmission line. This offers further degrees of freedom for impedance transformation, particularly impedance matching, e.g. be providing two or more different control voltages for the first transmission line and said at least one further transmission line.

According to further exemplary embodiments, said apparatus comprises a second transmission line, wherein said first transmission line is coupled to a first terminal of said RF device, and wherein said second transmission line is coupled to a second terminal of said RF device. As an example, the first terminal may be an input terminal to provide the RF device with an RF input signal, and the second terminal may be an output terminal where an RF output signal is provided by said RF device. Preferably, both the first and second transmission line may comprise said EC material a permittivity of which can be controlled, preferably individually for each of said transmission lines, by applying a respective control voltage, as already explained above. This way, flexible impedance transformation, e.g. matching, may be attained by tuning the first transmission line and/or the second transmission line.

According to further exemplary embodiments, said first transmission line and/or a or said at least one further transmission line comprise respectively a first conductor (e.g., copper or silver or gold or another electrically conductive material), a second conductor (e.g., copper or silver or gold or another electrically conductive material), and said EC material arranged between said first conductor and said second conductor.

According to further exemplary embodiments, said first transmission line and/or a or said at least one further transmission line may comprise a stack of layers, wherein said first conductor may form a first layer, said second conductor may form a second layer, and wherein said EC material may form a third layer arranged between said first layer and said second layer.

According to further exemplary embodiments, a propagation direction of an RF signal within said transmission line(s) may be orthogonal to a stack coordinate of said stack of layers. In other words, according to exemplary embodiments, said propagation direction of the RF signal within said transmission line(s) may be parallel to a virtual plane defined by said layers of said stack.

According to further exemplary embodiments, at least one electrolyte layer is provided a) between said first conductor and said EC material and/or b) between said second conductor and said EC material. According to further exemplary embodiments, said at least one electrolyte layer may comprise lithium niobate, $LiNbO_3$.

According to further exemplary embodiments, said EC material may comprise tungsten trioxide, $WO_3$.

According to further exemplary embodiments, said apparatus comprises a control device for at least temporarily applying at least one control voltage, for example said first control voltage and/or said further control voltage, to said EC material. This enables to tune the respective transmission line(s). Preferably, the control device is configured to provide several control voltages for individually controlling several transmission line(s) (or their EC material, respectively) independently of each other. This way, further degrees of freedom regarding impedance transformation, particularly impedance matching, are enabled.

According to further exemplary embodiments, said control device is configured to at least temporarily apply at least one bias voltage to at least one component of said at least one active semiconductor device, preferably independently of any control voltage for said EC material or the respective transmission lines. According to further exemplary embodiments, said active semiconductor device may be a field effect transistor, FET, and said at least one bias voltage may be a bias voltage for a gate electrode of said FET and/or a bias voltage for a drain electrode of said FET. Providing several bias voltages for several electrodes, e.g. the gate electrode and the drain electrode of said exemplary FET, is also possible according to further exemplary embodiments. According to further exemplary embodiments, said transistor bias voltage(s) and the tuning line EC voltage(s) may at least temporarily be adapted, e.g. by the control device, in a mutually coordinated manner, e.g. to optimize RF apparatus performance.

According to further exemplary embodiments, the one or more bias voltages may also be provided when using other types of active semiconductor devices, such as e.g. bipolar transistors, diodes, mixers, and the like.

According to further exemplary embodiments, said apparatus comprises at least one impedance transformation network, wherein said first transmission line forms part of said at least one impedance transformation network.

According to further exemplary embodiments, said apparatus comprises a first impedance transformation network coupled to a or the first terminal of said RF device and a second impedance transformation network coupled to a or said second terminal of said RF device. This way, impedance matching may be attained at both terminals of said RF device.

According to further exemplary embodiments, said first impedance transformation network and/or said second impedance transformation network comprise at least one transmission line which comprises an electro-chromic, EC, material a permittivity of which can be controlled by applying a respective control voltage to said transmission line. This enables dynamic impedance transformation or tuning.

According to further exemplary embodiments, at least one DC (direct current) blocking capacitor is provided a) between said first transmission line and said at least one RF device, and/or b), if said apparatus comprises at least two adjacent transmission lines, between said adjacent transmission lines. This enables to apply individual control voltages to the respective devices without interference between said individual control voltages, as the DC blocking capacitor(s) isolate adjacent DC voltage domains from each other, while enabling transmission of RF signals between said adjacent DC voltage domains.

According to further exemplary embodiments, at least one of said control voltages for said transmission line(s) and/or said bias voltages for said at least one active semiconductor device may comprise or represent a DC voltage signal, i.e. having a substantial portion of its signal energy at a frequency of zero.

According to further exemplary embodiments, at least one of said control voltages for said transmission line(s) and/or said bias voltages for said at least one active semiconductor device may comprise or represent a low frequency voltage signal, i.e. having a substantial portion of its signal energy at frequencies greater than zero. This e.g. enables to dynamically configure or tune the transmission line(s) and/or the at least one active semiconductor device using e.g. low frequency modulated voltage signals.

According to further exemplary embodiments, at least one filter, e.g. a high-pass filter, may be provided a) between said first transmission line and said at least one RF device, and/or b), if said apparatus comprises at least two adjacent transmission lines, between said adjacent transmission lines. The cut-off frequency of said at least one high-pass filter may be chosen such that said high-pass filter passes said RF signals between the first transmission line and said at least one RF device, and/or between said adjacent transmission lines, while blocking low frequency signals having a frequency lower than said RF signals, e.g. low frequency voltage signals which may be used to control said (EC material of said) transmission line(s) and/or to bias said at least one active semiconductor device. This way, dynamic tuning/biasing is enabled, while still isolating the different transmission line(s) and/or said active semiconductor device from each other regarding said tuning/biasing voltages, whereas RF signals are passed therebetween by said high-pass filter(s). As an example, said low frequency signals may comprise frequencies lower than one percent of said RF signals. According to further exemplary embodiments, said control device is configured to at least temporarily coordinate an application of said at least one bias voltage to at least one component of said at least one active semiconductor device with an application of a or said control voltage to said EC material of at least said first transmission line. This way, impedance transformation effected via said transmission line(s) may be coordinated with an operation of the at least one active semiconductor device, whereby a particularly efficient tuning of the apparatus is enabled. As an example, tuning said bias voltage(s) enables to (dynamically) shift an operating point of said at least one active semiconductor device, whereas tuning the control voltage(s) applied to said one or more transmission line(s) or their EC material enables to change the characteristic impedance of the respective transmission line(s). According to further exemplary embodiments, this approach may also be denoted as "mutual tuning", as both the transmission line(s) and the at least one active semiconductor device may be tuned.

According to further exemplary embodiments, said control device is configured to perform said mutual tuning simultaneously or subsequently or in an at least partly temporally overlapping fashion, e.g. by changing said one or more control voltages with respect to said one or more bias voltages, e.g. according to a predetermined temporal scheme and/or depending on at least one operational parameter of the apparatus (e.g., a parameter characterizing linearity (e.g., ACLR (adjacent channel leakage ratio), EVM (error vector magnitude)), and/or a parameter characterizing energy efficiency), e.g. to optimize the RF device (e.g. amplifier) for an actually operated frequency range and/or load situation.

According to further exemplary embodiments, said control device is configured to tune said bias voltage(s) and/or said control voltage(s) for said one or more transmission line(s) depending on a an analyzed quality of the signal which is fed back by a linearization path.

Further exemplary embodiments feature a method of manufacturing an apparatus comprising a first transmission line for transmitting radio frequency, RF, signals and an RF device comprising at least one active semiconductor device for processing RF signals, comprising: providing said first transmission line, wherein said first transmission line comprises an electro-chromic, EC, material a permittivity of which can be controlled by applying a first control voltage to said first transmission line, coupling said RF device to said first transmission line.

Further exemplary embodiments feature a method of operating an apparatus according to the embodiments comprising: at least temporarily providing a first control voltage to said EC material of said first transmission line.

According to further exemplary embodiments, said first control voltage is altered dynamically, i.e. during an operating time of said apparatus.

According to further exemplary embodiments, said apparatus comprises a plurality of transmission lines with EC material ("EC-based transmission line"), wherein said method comprises: at least temporarily providing a first control voltage to the EC material of at least a first group of said plurality of transmission lines, and/or at least temporarily providing a second control voltage, which is preferably different from said first voltage, to the EC material of at least a second group of said plurality of transmission lines, wherein said second group of transmission lines is different from said first group of transmission lines. Preferably, the first group and/or the second group each comprises at least one transmission line with EC material.

According to further exemplary embodiments, more than one EC-based transmission line may be provided, for example at an input and/or at an output of said RF device, e.g. forming said first group and/or said second group respectively. According to further exemplary embodiments, each of said more than one EC-based transmission lines of said first group or said second group may be controlled individually from the other ones of the same group.

According to further exemplary embodiments, said control device at least temporarily coordinates an application of at least one bias voltage to at least one component of said at least one active semiconductor device with an application said control voltage(s) to said EC material of at least said first transmission line.

Further exemplary embodiments relate to a use of the method according to the embodiments and/or of the apparatus according to the embodiments for at least one of: a) tuning a characteristic impedance of at least said first transmission line, b) impedance matching, c) coordinated tuning of said characteristic impedance of at least said first transmission line and an operating point of said at least one active semiconductor device, d) providing an RF amplifier device, e.g. of the Doherty type or the LINC type or the Envelope Tracking type.

BRIEF DESCRIPTION OF THE FIGURES

Some exemplary embodiments will now be described with reference to the accompanying drawings in which.

DESCRIPTION OF EXEMPLARY EMBODIMENTS

Figure 1:
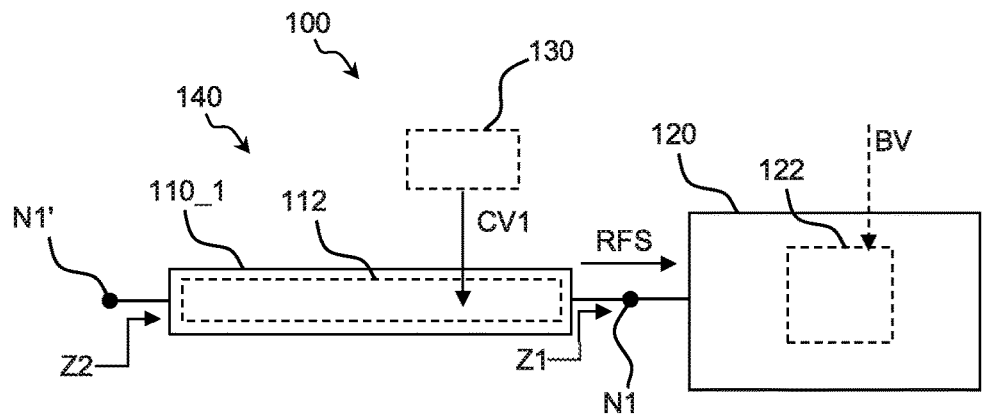
FIG. 1 schematically depicts a simplified block diagram of an apparatus according to exemplary embodiments, FIG. 2 schematically depicts a simplified block diagram of an apparatus according to further exemplary embodiments, FIG. 3 schematically depicts a simplified side view of a transmission line according to further exemplary embodiments, FIG. 4 schematically depicts a simplified side view of a transmission line according to further exemplary embodiments, FIG. 5 schematically depicts a simplified block diagram of an apparatus according to further exemplary embodiments, FIG. 6 schematically depicts a simplified block diagram of an apparatus according to further exemplary embodiments, FIG. 7A schematically depicts a simplified Smith chart according to further exemplary embodiments, FIG. 7B schematically depicts a simplified chart related to operating parameters of a transistor according to further exemplary embodiments, FIG. 8 schematically depicts a simplified flow chart of a method according to further exemplary embodiments, FIG. 9A schematically depicts a simplified flow chart of a method according to further exemplary embodiments, FIG. 9B schematically depicts a simplified block diagram of an apparatus for use with the method of FIG. 9A according to further exemplary embodiments, FIG. 10A schematically depicts a simplified flow chart of a method according to further exemplary embodiments, FIG. 10B schematically depicts a simplified block diagram of an apparatus for use with the method of FIG. 10A according to further exemplary embodiments, FIG. 11A schematically depicts a simplified flow chart of a method according to further exemplary embodiments, FIG. 11B schematically depicts a simplified block diagram of an apparatus for use with the method of FIG. 11A according to further exemplary embodiments, and FIG. 12 schematically depicts a simplified block diagram of an apparatus according to further exemplary embodiments.

FIG. 1 schematically depicts a simplified block diagram of an apparatus 100 according to exemplary embodiments.

The apparatus 100 comprises a first transmission line 110_1 for transmitting radio frequency, RF, signals RFS and an RF device 120 comprising at least one active semiconductor device 122 for processing RF signals, e.g. the RF signal RFS transmitted via said first transmission line 110_1. For this purpose, the RF device 120 is coupled to said first transmission line 110_1, cf. the exemplary node N1. Note that according to further exemplary embodiments, said node N1 of FIG. 1 may comprise more than one, e.g. two, terminals (not shown), wherein a first terminal may comprise a constant, electric reference potential such as a ground potential, and wherein a second terminal may be associated with said radio frequency signal RFS.

Said first transmission line 110_1 comprises an electro-chromic, EC, material 112 a permittivity of which can be controlled by applying a first control voltage CV1 to said first transmission line 110_1. This enables to effect a change of electric characteristics of the first transmission line 110_1 such as e.g. the characteristic impedance $Z_0$ of said first transmission line 110_1, e.g. by altering the first control voltage CV1. In other words, according to further exemplary embodiments, an effective electric length of said first transmission line 110_1 may be controlled and/or influenced by altering the first control voltage CV1. This way, an impedance transformation of said input impedance Z1 of said RF device 120 to said transformed input impedance Z2 effected by said first transmission line 110_1 may be influenced depending on said first control voltage CV1, which e.g. enables impedance matching to another device, e.g. by choosing an appropriate first control voltage CV1.

According to further exemplary embodiments, said first control voltage CV1 may also be changed dynamically, i.e. during operation of said apparatus 100 and/or its RF device 120, respectively, so that the characteristic impedance $Z_0$ of the first transmission line 110_1 may also be altered dynamically. According to further exemplary embodiments, this enables tuning of said characteristic impedance $Z_0$ of the first transmission line 110_1 thus e.g. compensating ageing effects of components 110_1, 120 of the apparatus and/or manufacturing tolerances and/or adapting (e.g., optimization of the embodiment 100) to different operating conditions (load situation, frequency band, etc.).

According to further exemplary embodiments, said EC material 112 is a material which allows its optical and/or electrical properties to be controlled by applying a voltage, e.g. the first control voltage CV1.

According to further exemplary embodiments, a control device 130 may be provided which is configured to apply said first control voltage CV1 to said first transmission line 110_1.

According to further exemplary embodiments, as already mentioned above, the first transmission line 110_1 may e.g. be used to effect an impedance transformation of said RF device 120. In other words, the first transmission line 110_1 may be used as an impedance transformer. Advantageously, by altering the first control voltage CV1 applied to the EC material 112 of said first transmission line 110_1, the degree of impedance transformation effected by said first transmission line 110_1 may be controlled. This way, a dynamically (i.e., during operating time) tuneable impedance transformer 140 may be provided, e.g. enabling at least one of: a) adapting the input line impedance to different operating conditions (for example, operating points, load situation, addressed frequency band) of the active device 122, b) matching an impedance of said RF device 120 to another device (not shown), which may e.g. also be coupled to said first transmission line 110_1, cf. e.g. node N1'.

According to further exemplary embodiments, said RF device 120 may comprise or is, but not limited to, at least one of: a) an amplifier, e.g. a power amplifier, PA, or a low noise amplifier, LNA, b) a transmitter, c) a receiver, d) a transceiver.

According to further exemplary embodiments, said amplifier may comprise at least one of the following types: a) Class-A, b) Class-B, c) Class-C, d) Class-D, e) push-pull amplifier, f) Doherty amplifier, g) LINC (Linear Amplification using Nonlinear Components) amplifier, h) Envelope Tracking amplifier, i) single- or wideband amplifier, etc.

According to further exemplary embodiments, said RF signals RFS may e.g. be in the cm-wave range and/or in the mm-wave range, etc.

According to further exemplary embodiments, said first transmission line 110_1 may transmit a first RF signal RFS to said RF device 120, and said RF device may be configured to process said first RF signal RFS. Such exemplary configuration may e.g. be used for supplying an amplifier or a transmitter with an RF signal to be transmitted via an air interface.

According to further exemplary embodiments, said RF device 120 may comprise a transceiver or receiver for receiving a second RF signal, e.g. via an air interface, and said RF device 120 may provide said received (i.e., second) RF signal or a further (RF) signal derived from said received RF signal to said first transmission line 110_1, e.g. for transmitting it to a further device (not shown) that may be connected to the node N1'.

According to further exemplary embodiments, said at least one active semiconductor device 122 is a transistor, e.g. RF transistor, e.g. bipolar transistor or field effect transistor, FET. According to further exemplary embodiments, said at least one active semiconductor device 122 may comprise a plurality of electric and/or electronic elements, wherein one or more transistors, particularly RF transistors, may be provided. According to further exemplary embodiments, using the tuneable first transmission line 110_1, impedance matching between the RF device 120 and the first transmission line 110_1 may be effected.

Figure 2:
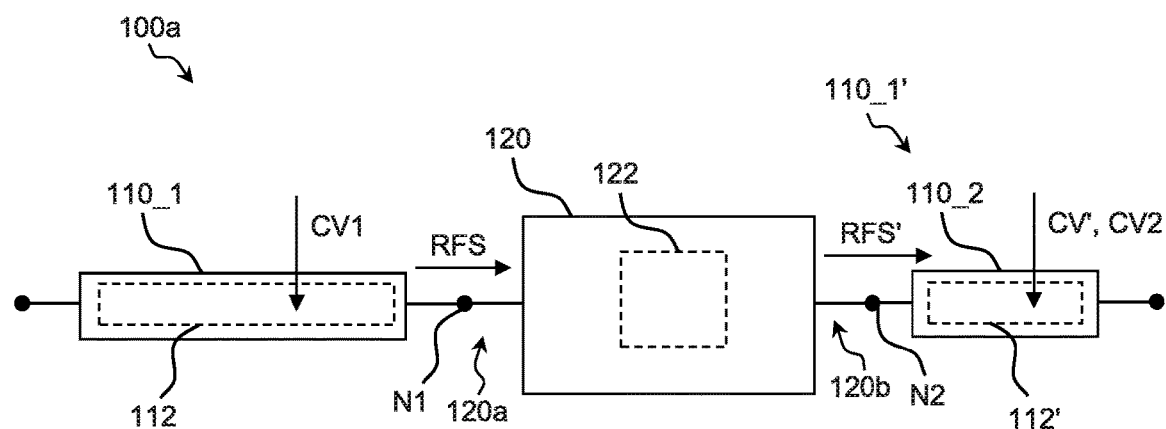

According to further exemplary embodiments, cf. FIG. 2, said apparatus 100a comprises at least one further transmission line 110_1', e.g. a second transmission line 110_2, that presently also comprises an electro-chromic, EC, material 112' a permittivity of which can be controlled by applying a further, i.e. second, control voltage CV', CV2 to said at least one further transmission line 110_1'. This offers further degrees of freedom for impedance transformation, particularly impedance matching, e.g. by providing two or more different control voltages CV1, CV2 for the first transmission line 110_1 and said at least one further transmission line 110_1'.

According to further exemplary embodiments, said apparatus 100a comprises a second transmission line 110_2, wherein said first transmission line 110_1 is coupled to a first terminal 120a of said RF device 120, and wherein said second transmission line 110_2 is coupled to a second terminal 120b of said RF device 120, also cf. node N2. As an example, the first terminal 120*a* may be an input terminal to provide the RF device with an RF input signal RFS, and the second terminal 120*b* may be an output terminal where an RF output signal RFS' (e.g., an amplified RF input signal) is provided by said RF device 120. Preferably, both the first and second transmission line 110_1, 110_2 may comprise said EC material 112, 112' a permittivity of which can be controlled, preferably individually for each of said transmission lines 110_1, 110_2, by applying a respective control voltage CV1, CV2, as already explained above. This way, flexible impedance transformation, e.g. matching, may be attained by tuning the first transmission line 110_1 and/or the second transmission line 110_2.

Figure 3:
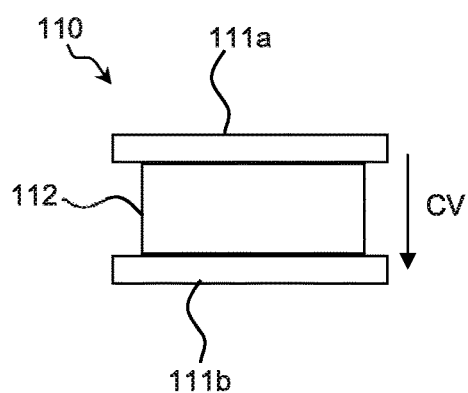

According to further exemplary embodiments, cf. FIG. 3, said first transmission line 110_1 and/or a or said at least one further transmission line comprises a first conductor 111*a* (e.g., copper or silver or gold or another electrically conductive material), a second conductor 111*b* (e.g., copper or silver or gold or another electrically conductive material), and said EC material 112 arranged between said first conductor and said second conductor. As can also be seen from FIG. 3, the control voltage CV to change the permittivity of the EC material 112 may be applied to the conductors 111*a*, 111*b*. As an example, the first conductor 111*a* may be used as a signal conductor of said transmission line 110, and the second conductor 111*b* may be connected to a reference potential such as e.g. ground potential.

According to further exemplary embodiments, also cf. FIG. 3, said first transmission line 110 and/or a or said at least one further transmission line may comprise a stack of layers, wherein said first conductor 111*a* may form a first layer, said second conductor 111*b* may form a second layer, and wherein said EC material 112 may form a third layer arranged between said first layer 111*a* and said second layer 111*b*.

Figure 4:
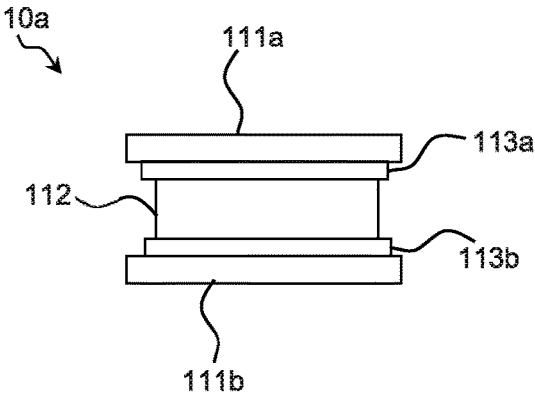

According to further exemplary embodiments, cf. FIG. 4, at least one electrolyte layer 113*a* is provided a) between said first conductor 111*a* and said EC material 112 and/or b) between said second conductor 111*b* and said EC material 112, cf. the electrolyte layer 113*b*. According to further exemplary embodiments, said at least one electrolyte layer 113*a*, 113*b* may comprise lithium niobate, LiNbO$_3$.

According to further exemplary embodiments, said EC material 112, 112' may comprise tungsten trioxide, WO$_3$.

According to further exemplary embodiments, other configurations and/or materials known to the skilled person may also be used to form said EC material 112 and/or said stack of layers.

According to further exemplary embodiments, said apparatus 100, 100*a* respectively comprise a control device 130 (FIG. 1) for at least temporarily applying at least one control voltage CV (FIG. 3), for example said first control voltage CV1 (FIG. 1, 2) and/or said further control voltage CV' (FIG. 2), to said EC material 112, 112'. This enables to tune the respective transmission line(s) 110_1, 110_2 comprising said EC material 112, 112'. The control device 130 (FIG. 1) may be configured to provide several control voltages CV1, CV2 for individually controlling several transmission line(s) 110_1, 110_2 (or their EC material, respectively) independently of each other. This way, further degrees of freedom regarding impedance transformation, particularly impedance matching, are enabled.

According to further exemplary embodiments, said control device 130 is configured to at least temporarily apply at least one bias voltage BV (FIG. 1) to at least one component of said at least one active semiconductor device 122, which may be performed independently of any control voltage CV1, CV2 for said EC material or the respective transmission lines. According to further exemplary embodiments, said control device 130 is configured to determine said at least one bias voltage BV in coordination with at least one control voltage CV1, CV2 for said EC-based transmission lines, e.g. to optimize an overall setup for different load situations, and/or different frequency bands, etc.

According to further exemplary embodiments, said active semiconductor device 122 may be a field effect transistor, FET, and said at least one bias voltage BV may be a bias voltage for a gate electrode of said FET 122 and/or a bias voltage for a drain electrode of said FET 122. Providing several bias voltages for several electrodes, e.g. the gate electrode and the drain electrode of said exemplary FET, is also possible according to further exemplary embodiments.

According to further exemplary embodiments, the one or more bias voltages BV may also be provided when using other types of active semiconductor devices, such as e.g. bipolar transistors, diodes, mixers, and the like. According to further exemplary embodiments, the one or more bias voltages BV may be used to influence an operating point of the active semiconductor device 122.

According to further exemplary embodiments, said apparatus 100 (FIG. 1) comprises at least one impedance transformation network 140, wherein said first transmission line 110_1 forms part of said at least one impedance transformation network.

Figure 5:
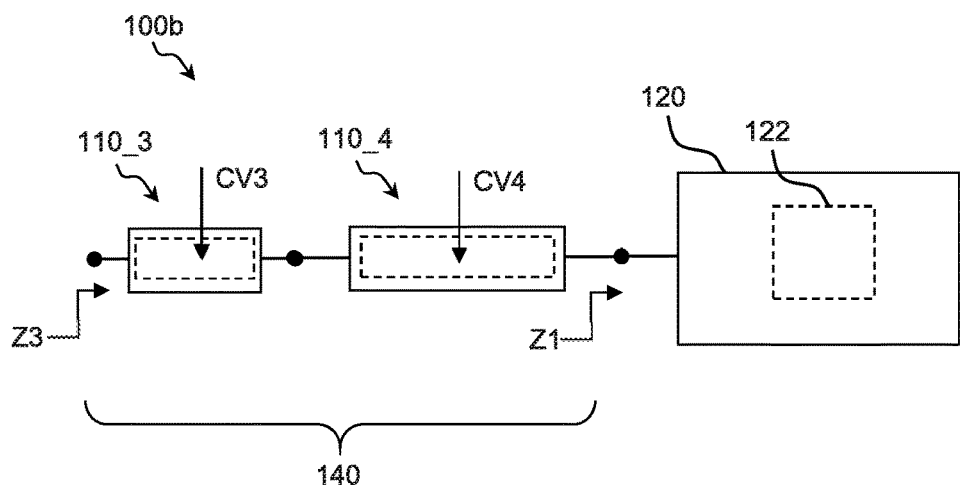

FIG. 5 schematically depicts a simplified block diagram of an apparatus 100*b* according to further exemplary embodiments. Apparatus 100*b* comprises an impedance transformation network 140 comprising two transmission lines 110_3, 110_4. The impedance transformation network 140 is configured to transform an input impedance Z1 of the RF device 120 to a further impedance Z3. In some embodiments, both transmission lines 110_3, 110_4 comprise EC material 112 (FIG. 1) as exemplarily explained above with respect to e.g. FIG. 1, 3, so that individual tuning, e.g. altering of a permittivity, can be performed by applying a respective control voltage CV3, CV4.

Figure 6:
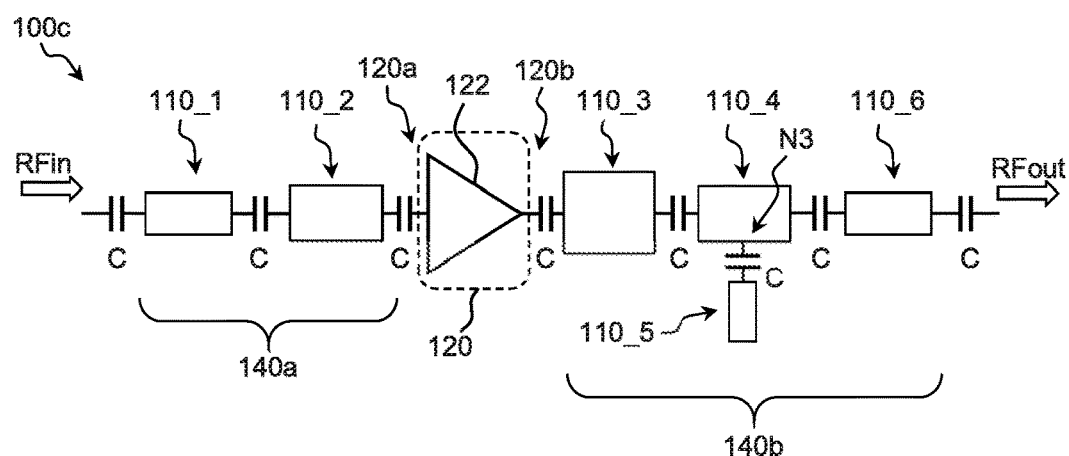

According to further exemplary embodiments, cf. FIG. 6, the apparatus 100*c* comprises a first impedance transformation network 140*a* coupled to an input terminal 120*a* of said RF device 120 and a second impedance transformation network 140*b* coupled to an output terminal 120*b* of said RF device 120. This way, impedance matching may be attained at both terminals 120*a*, 120*b* of said RF device 120.

According to further exemplary embodiments, said first impedance transformation network 140*a* and/or said second impedance transformation network 140*b* comprises at least one transmission line respectively which comprises an electro-chromic, EC, material 112 (FIG. 3) a permittivity of which can be controlled by applying a respective control voltage to said transmission line. This enables dynamic impedance transformation or tuning.

Presently, in the exemplary embodiment 100*c* according to FIG. 6, the first impedance transformation network 140*a* comprises two transmission lines 110_1, 110_2, and the second impedance transformation network 140*b* comprises four transmission lines 110_3, 110_4, 110_5, 110_6, wherein transmission line 110_5 forms a stub line coupled to transmission line 110_4.

According to further exemplary embodiments, stub line 110_5 may comprise a first end section which is an open circuit and a second end section via which it is coupled to the transmission line 110_4, thus transforming the open circuit of its first end section to another impedance value at the coupling point N3 to the transmission line 110_4. In other words, stub line 110_5 may be connected in parallel to transmission line 110_4 at node N3.

According to further exemplary embodiments, at least one DC (direct current) blocking capacitor C is provided a) between said first transmission line and said at least one RF device, and/or b), if said apparatus comprises at least two adjacent transmission lines, between said adjacent transmission lines. This enables to apply individual control voltages to the respective devices without interference between said individual control voltages, as the DC blocking capacitor(s) isolate adjacent DC voltage domains from each other, while enabling transmission of RF signals between said adjacent DC voltage domains.

Presently, the exemplary configuration 100c according to FIG. 6 comprises eight DC blocking capacitors C of same or similar or different value, thus partitioning the apparatus 100c into at least seven different DC voltage domains. This enables to apply individual control voltages CV (not shown in FIG. 6, cf. e.g. FIG. 3) to the various transmission lines 110_1, 110_2, . . . , 110_6 or their EC materials, respectively. Similarly, according to further embodiments, one or more bias voltages BV (not shown in FIG. 6, cf. e.g. FIG. 1) may be applied to element 122 of the RF device 120, which are also isolated from adjacent transmission lines 110_2, 110_3 by means of respective DC block capacitors C.

According to further exemplary embodiments, at least one of said control voltages CV for said transmission line(s) and/or said bias voltages BV for said at least one active semiconductor device 122 may comprise or represent a DC voltage signal, i.e. having a substantial portion of its signal energy at a frequency of zero.

According to further exemplary embodiments, at least one of said control voltages CV for said transmission line(s) and/or said bias voltages BV for said at least one active semiconductor device 122 may comprise or represent a low frequency voltage signal, i.e. having a substantial portion of its signal energy at frequencies greater than zero. This e.g. enables to dynamically configure or tune the transmission line(s) and/or the at least one active semiconductor device using e.g. low frequency modulated voltage signals CV, BV.

According to further exemplary embodiments, at least one filter (not shown), e.g. a high-pass filter, may be provided a) between said first transmission line and said at least one RF device, and/or b), if said apparatus comprises at least two adjacent transmission lines, between said adjacent transmission lines, e.g. instead of at least one of said DC blocking capacitors C exemplarily depicted by FIG. 6. The cut-off frequency of said at least one high-pass filter may be chosen such that said high-pass filter passes said RF signals between the first transmission line and said at least one RF device, and/or between said adjacent transmission lines, while blocking low frequency signals having a frequency lower than said RF signals, e.g. low frequency voltage signals which may be used to control said (EC material of said) transmission line(s) and/or to bias said at least one active semiconductor device. This way, dynamic tuning/biasing is enabled, while still isolating the different transmission line(s) and/or said active semiconductor device from each other regarding said tuning/biasing voltages, whereas RF signals are passed therebetween by said high-pass filter(s). As an example, said low frequency signals may comprise frequencies lower than one percent of said RF signals.

According to further exemplary embodiments, an RF input signal RFin may be provided to the apparatus 100c, which is transmitted via the first impedance transformation or matching network 140a to the RF device 120, e.g. for (further) processing such as e.g. amplification, and a so processed, e.g. amplified, RF signal is transmitted from the output terminal 120b of the RF device 120 via the second impedance transformation or matching network 140b, cf. reference sign RFout.

Figure 7A:
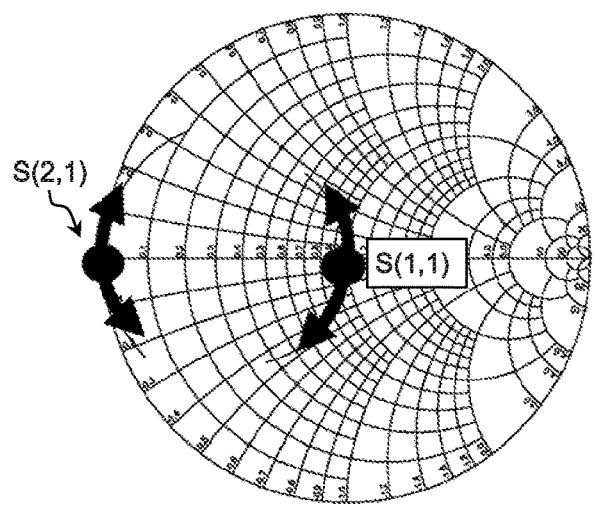

FIG. 7A exemplarily depicts scattering parameters S(1,1) and S(2,1) to illustrate the effect of impedance transformation as e.g. enabled by the EC-material-based transmission lines 110_1, 110_2 of the first impedance transformation network 140a. The values of the respective scattering parameters S(1,1) and S(2,1) will move around in the Smith chart of FIG. 7A if the transmission lines 110_1, 110_2 are being tuned by applying respective control voltages to their EC material 112 (FIG. 3).

Figure 7B:
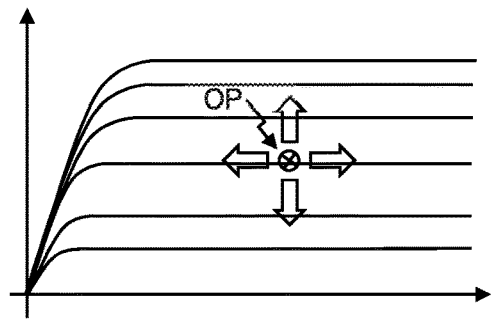

Similarly, FIG. 7B exemplarily depicts possible changes on an operating point OP of a FET as active semiconductor device 122.

According to further exemplary embodiments, said control device 130 (FIG. 1) is configured to at least temporarily coordinate an application of said at least one bias voltage BV to at least one component of said at least one active semiconductor device 122 with an application of a or said control voltage CV (FIG. 3) to said EC material 112 of at least said first transmission line 110_1. This way, impedance transformation effected via said transmission line(s) 110_1, . . . may be coordinated with an operation of the at least one active semiconductor device 122, whereby a particularly efficient tuning of the apparatus is enabled.

As an example, tuning said bias voltage(s) enables to (dynamically) shift an operating point OP (FIG. 7B) of said at least one active semiconductor device 122, whereas tuning the control voltage(s) CV applied to said one or more transmission line(s) or their EC material enables to change the characteristic impedance of the respective transmission line(s), thus e.g. influencing impedance transformation, cf. the scattering parameters exemplarily depicted by FIG. 7A. According to further exemplary embodiments, this approach may also be denoted as "mutual tuning", as both the transmission line(s) and the at least one active semiconductor device may be tuned.

According to further exemplary embodiments, such "mutual tuning" may also be performed simultaneously or subsequently or in an at least partly temporally overlapping fashion, e.g. by changing said one or more control voltages with respect to said one or more bias voltages, e.g. according to a predetermined temporal scheme and/or depending on at least one operational parameter of the apparatus (e.g., a parameter characterizing linearity (e.g., ACLR (adjacent channel leakage ratio), EVM (error vector magnitude)), and/or a parameter characterizing energy efficiency), e.g. to optimize the RF device 120 (e.g. amplifier) for an actually operated frequency range and/or load situation.

FIG. 8 schematically depicts a simplified flow chart of a method according to further exemplary embodiments, which method may e.g. be performed by the apparatus 100c of FIG. 6, exemplarily assuming that RF device 120 is an amplifier. In step 200 (FIG. 8), one or more bias voltages BV (FIG. 1) are applied to the RF amplifier 120 (FIG. 6). In step 202 (FIG. 8), one or more control voltages are applied to at least one of the transmission lines 110_1, 110_2, . . . , 110_6. Optionally, in step 204, one or more of said control voltages applied to at least one of the transmission lines of the first impedance matching network 140a may be adjusted (i.e., changed). Optionally, in step 206, one or more of said control voltages applied to at least one of the transmission lines of the second impedance matching network 140b may be adjusted. Optionally, in step 208, one or more of said bias voltages for said RF amplifier 120 may be adjusted. In step 210, it is determined whether a required performance of the apparatus 100c (FIG. 6) is achieved, wherein the required performance may e.g. be characterized by at least one of: a) carrier frequency, b) output power (which may e.g. be adapted to a load situation), c) energy efficiency, d) linearity (e.g., ACLR, EVM). If said required performance is achieved, the method proceeds with step 211, which can be considered as a state characterizing a completion of a tuning procedure. Optionally, current values of the control voltage(s) and/or biasing voltages may at least temporarily be stored, e.g. for future use. As an example, a look-up table may be built on the basis of these values. According to further exemplary embodiments, an identifier e.g. characterizing at least one of a load situation and a frequency band may be used for storing and/or retrieving a data set comprising e.g. at least one control voltage value and/or at least one biasing voltage value.

If said required performance is not (yet) achieved, the method proceeds with step 204, cf. arrow A1, i.e. repeating one or more of said tuning or adjusting steps 204, 206, 208. Note that according to further exemplary embodiments, at least one of these tuning or adjusting steps 204, 206, 208 is optional and may e.g. at least temporarily (e.g., for some iterations A1) be omitted. According to further exemplary embodiments, other strategies and/or algorithms may also at least temporarily be used.

The further arrow A2 of FIG. 8 characterizes a monitoring of a quality parameter characterizing an operation of the apparatus 100c, said quality parameter e.g. characterizing a signal quality of the RF output signal RFout. Said monitoring may be continuous.

FIG. 9A schematically depicts a simplified flow chart of a method according to further exemplary embodiments, and FIG. 9B
schematically depicts a simplified block diagram of an apparatus 100d for use with the method of FIG. 9A.

In step 220, one or more control voltages for the EC-material-based transmission lines 110_1, 110_2 and/or bias voltages for the RF amplifier 120 are preset, e.g. by means of controllable voltage sources VS, which may be under control of a central control device 130' which may also comprise a look-up table LUT as already mentioned above, and/or manually, cf. the hand H. In step 222, one or more bias voltages for the RF amplifier 120 are changed, i.e. tuned, either manually or automated (e.g., by means of control device 130'). Step 224 may comprise a visualisation and/or analysis of an output signal OS. In step 226, it is determined whether a current voltage adjustment, cf. e.g. step 222, is sufficient for the output signal OS to meet one or more predetermined requirements and/or a specification. If so, in step 228 the currently adjusted control and/or bias voltages (or respective data characterizing said voltage values, e.g. said identifier mentioned above) may be stored, e.g. in a non-volatile memory, which may e.g. be integrated into said control device 130'. If not, cf. arrow A3, the procedure is continued with step 222. Block OSM of FIG. 9B exemplarily depicts an output signal monitoring device and/or process, which may be used e.g. for step 224 of FIG. 9A.

FIGS. 9A and 9B characterize an exemplary setup and method for either automatic or manual tuning of the apparatus 100d, which may also be denoted as "EC-based flexible amplifier". The setup and/or method of FIG. 9 may e.g. be used in a production facility, e.g. during a procedure of putting apparatus 100d into initial operation. In order to assess the performance achieved by actual applied control and bias voltages (cf. the presets of step 220), the output signal OS may continuously be monitored, analyzed and visualized, cf. e.g. step 224 of FIG. 9A and block OSM of FIG. 9B.

According to further exemplary embodiments, in case of manual tuning, the respective EC RF line segment control voltages CV as well as transistor biasing voltages BV may be applied, particularly swept, while, optionally continuously, monitoring the output signal performance, until the required/targeted performance is achieved. Once the required/targeted performance is achieved, the respective voltages may be imprinted and if useful (depending on concept) be stored, e.g. in a LUT, for later application scenario related recall.

According to further exemplary embodiments, if the tuning is not done manually but e.g. in an automated manner, for example in a fab, a suitable tuning equipment, e.g. control device 130', which may be comprising functionality of output signal monitoring, analysis and assessment as well as functionality for control of the individual EC and control voltages CV, BV to be tuned, may be used.

According to further exemplary embodiments, a first look-up table LUT may be used to provide e.g. starting values for the control voltages CV (and/or bias voltages BV) and a further look-up table may be used for later storing different application scenario (load, frequency, etc.) related control voltage data for later recall.

Figure 10A:
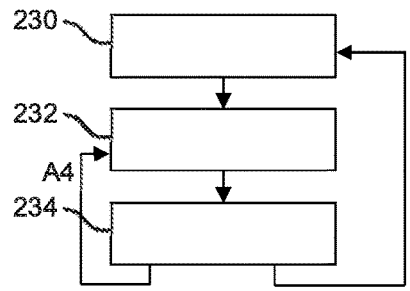
Figure 10B:
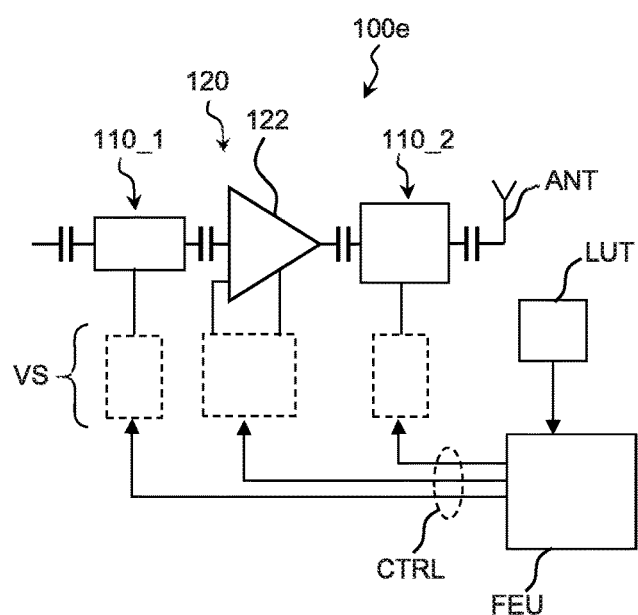

FIG. 10A schematically depicts a simplified flow chart of a method according to further exemplary embodiments, and FIG. 10B schematically depicts a simplified block diagram of an apparatus 100e for use with the method of FIG. 10A. The concept of FIG. 10 is particularly suited for application in in the field. A digital RF frontend unit FEU is provided which e.g. controls individual EC-based RF matching line segment voltage sources VS, cf. the control line CTRL, as well as one or more voltage sources VS for providing one or more transistor biasing voltages. The apparatus 100e is equipped with a look-up table LUT, comprising data, e.g. in the form of parameter sets, for different application scenarios (e.g., depending on a load situation, frequency, etc.), characterizing values for control and bias voltages, which may be used and/or recalled by the digital RF frontend unit FEU and applied to the tunable EC based amplifier depending upon which application scenario is currently relevant. An exemplary related method according to further preferred embodiments is shown by FIG. 10A. In step 230, the data (e.g. the parameter sets) are retrieved from the table LUT, in step 232, a signal transmission is performed, e.g. in a downlink direction, wherein an RF signal processed by the RF amplifier 120 is forwarded to an antenna ANT implementing an air (or free space) interface. In step 234 it is determined if the application scenario for which said parameter set has been retrieved in step 230 is still valid. If so, the procedure may proceed with step 232, cf. arrow A4, and if not, the procedure branches to step 230, e.g. for retrieving another parameter set.

Figure 11A:
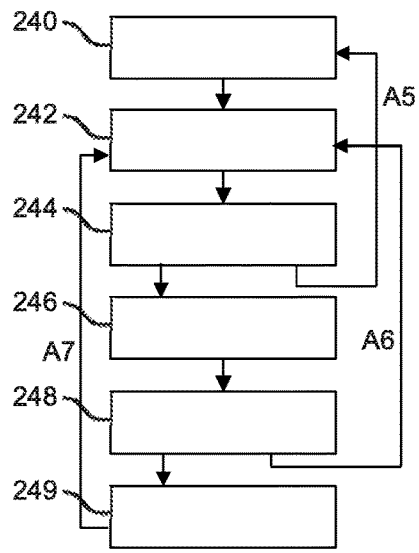
Figure 11B:
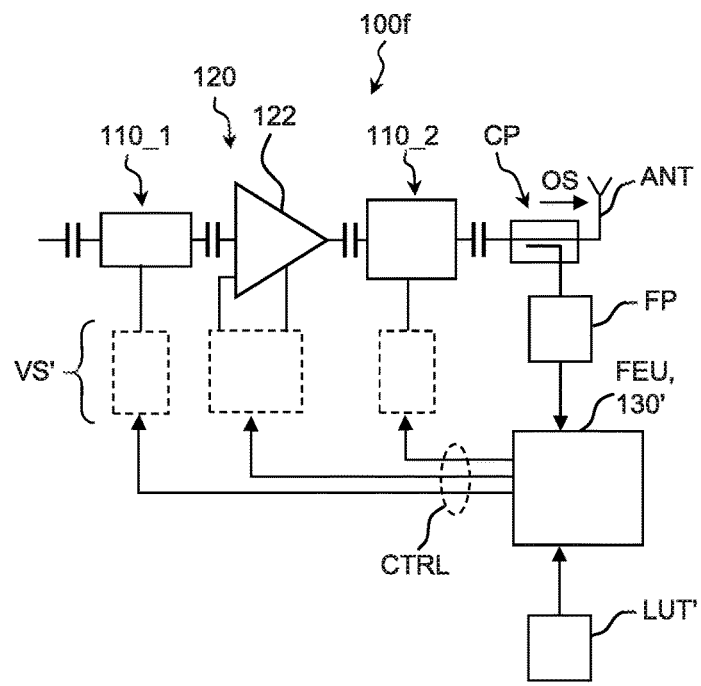

FIG. 11A schematically depicts a simplified flow chart of a method according to further exemplary embodiments, and FIG. 11B schematically depicts a simplified block diagram of an apparatus 100f for use with said method. Similar to the FIG. 10 embodiment explained above, the apparatus 100f of FIG. 11 is also particularly suited for application in the field. Apparatus 100f advantageously enables continuously monitoring an output signal quality and, if necessary, continuously tuning/adjusting the individual EC control voltages and transistor biasing voltages to a current application scenario (e.g., load situation, frequency, etc.) and signal quality (e.g., linearity, temperature, aging, etc.). In order to support these additional features, a feedback path FP is provided in order to tap the output signal OS (e.g., by means of coupler CP) and allow for monitoring, analysis and assessment of the signal, which may then be used for, preferably continuous, adaptive amplifier tuning by controlling the EC voltages and/or transistor bias voltages, cf. the control signal CTRL and the various controllable voltage sources VS'.

According to further preferred embodiments, a feedback path may already be available in some configurations, e.g. in order to support linearization (e.g., by using digital pre-distortion), so that an already existing feedback path may additionally be used for a process of "amplifier tuning", i.e. influencing the permittivity of the EC material of the transmission lines 110_1, 110_2 and/or biasing the transistor 122.

According to further preferred embodiments, if linearization is used, a coordination between a linearization entity (not shown) performing said linearization and the control device 130' may be beneficial. In further exemplarily embodiments, a look-up table LUT' is proposed, in order to provide e.g. a control and biasing voltage data set when starting up the apparatus 100f. Furthermore, the look-up table LUT' may comprise data sets for different major application scenarios (e.g., load situation, frequency, etc.) in order to simply/reduce effort of control and bias voltage tuning by having respective basic application scenario related starting data sets available for recall.

Turning to FIG. 11A, steps 240, 242, 244 may correspond to steps 230, 232, 234 of FIG. 10A. If in step 244 it is determined that an application scenario is still valid, in step 246 a monitoring of the output signal quality, e.g. linearity, is performed. Otherwise, the process proceeds to step 240, cf. arrow A5 retrieving another parameter set. In step 248, the output signal OS may be analyzed, e.g. for determining whether control voltage tuning may be useful. If so, in step 249, tuning of at least one, or alternatively all possible, control voltages (for transmission lines 110_1, 110_2 and for the transistor 122) is performed. After that, the procedure continues with step 242, cf. arrow A7. If in step 248 it is determined that control voltage tuning would not be useful, the procedure continues with step 242, cf. arrow A6.

Figure 12:
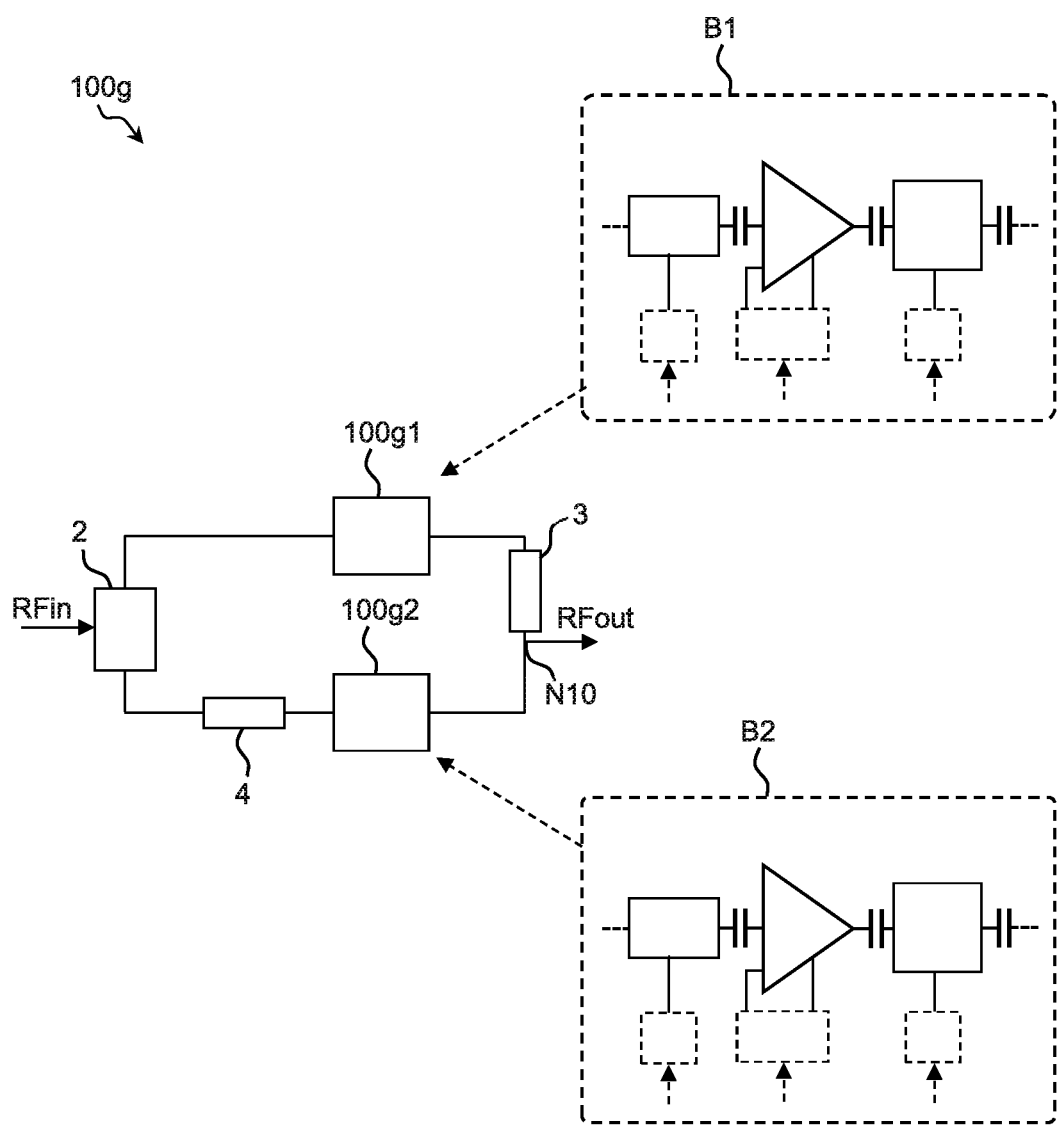

FIG. 12 schematically depicts a simplified block diagram of an apparatus 100g according to further exemplary embodiments. The configuration 100g of FIG. 12 indicates as an example a possible implementation of the principle according to the embodiments to a Doherty amplifier concept, which may be used e.g. to improve amplifier backoff efficiency in case of amplitude modulated signals.

Apparatus 100g comprises a power divider 2 for receiving an RF input signal RFin, a main branch comprising a first amplifier 100g1 connected in series with a quarter-wavelength transmission line 3, and an auxiliary branch comprising a further quarter-wavelength transmission line 4 in series with a second amplifier 100g2, wherein the main branch and the auxiliary branch are connected with each other at node N10, where an RF output signal RFout is provided. While not depicted by FIG. 12, as per se known from the Doherty principle, node N10 may comprise a combiner functionality combining the output signals of the main branch and the auxiliary branch.

The first amplifier 100g1 may e.g. comprise a structure similar or identical to the apparatus 100a of FIG. 2 or to the apparatus 100c of FIG. 6 and may preferably be configured as class-A or class-AB amplifier. The second amplifier 100g2 of FIG. 12 may e.g. comprise a structure similar or identical to the apparatus 100a of FIG. 2 or to the apparatus 100c of FIG. 6 and may preferably be configured as class-B or class-B/C amplifier.

In some exemplary embodiments, each of said amplifiers 100g1, 100g2 comprises at least one transmission line 110 (FIG. 3) according to the embodiments, and/or impedance transformation networks 140a, 140b based thereon, also cf. FIG. 6. Exemplary details of the amplifiers 100g1, 100g2 are depicted by FIG. 12 within the dashed rectangle blocks B1, B2.

According to further exemplary embodiments, EC-based RF matching network control voltages and/or transistor bias voltages of both amplifiers 100g1, 100g2 may be mutually coordinated for even further improved performance.

According to further exemplary embodiments, for even further advanced tunability of the amplifier 100g, the input power divider 2 as well as the combiner N10 on the output side may also be implemented by using one or more EC-based RF lines 110 in order to achieve tunability.

According to further exemplary embodiments, the principle according to the embodiments related to EC-material-based tuning, cf. FIG. 3, e.g. for RF amplifiers, is not restricted to the above-discussed amplifier types, but may, according to further exemplary embodiments, also be applied to other operation modes and/or concepts like envelope tracking, LINC, etc., as well as to different power classes and frequencies, as well as for single- and multiband application, as well as to other types of RF devices 120 (FIG. 6).

According to further exemplary embodiments, the principle according to the embodiments may also be applied to other amplifier types, like low noise amplifier, in this case also allowing to tune e.g. relevant noise figure, or variable gain amplifier, etc.

According to further exemplary embodiments, the principle according to the embodiments may also be used for providing tunable stubs 110_5 (FIG. 6), which may e.g. be used for harmonic notching.

According to further exemplary embodiments, one or more bias voltages for said active semiconductor device 122 may directly be applied to a semiconductor device package, optionally with integrated DC clocking capacitors. This enables to even tune transmission lines 110_2, 110_3 (FIG. 6) directly adjacent to, e.g. connected with, said RF device 120 or its active semiconductor device 122.

Further exemplary embodiments feature a method of manufacturing an apparatus according to the embodiments, i.e. comprising a first transmission line 110_1 (FIG. 1) for transmitting radio frequency, RF, signals and an RF device 120 comprising at least one active semiconductor device for processing RF signals, comprising: providing said first transmission line 110_1, wherein said first transmission line comprises an electro-chromic, EC, material a permittivity of which can be controlled by applying a first control voltage to said first transmission line, coupling said RF device 120 to said first transmission line 110_1.

Further exemplary embodiments feature a method of operating an apparatus according to the embodiments comprising: at least temporarily providing a first control voltage to said EC material of said first transmission line.

According to further exemplary embodiments, said first control voltage is altered dynamically, i.e. during an operating time of said apparatus.

According to further exemplary embodiments, said apparatus comprises a plurality of transmission lines with EC material 112, wherein said method comprises: at least temporarily providing a first control voltage to the EC material of at least a first group of said plurality of transmission lines, and/or at least temporarily providing a second control voltage, which may be different from said first voltage, to the EC material of at least a second group of said plurality of transmission lines, wherein said second group of transmission lines is different from said first group of transmission lines. The first group and/or the second group may each comprise at least one transmission line with EC material.

According to further exemplary embodiments, said control device at least temporarily coordinates an application of at least one bias voltage to at least one component of said at least one active semiconductor device with an application of said control voltage(s) to said EC material of at least said first transmission line.

Further exemplary embodiments relate to a use of the method according to the embodiments and/or of the apparatus according to the embodiments for at least one of: a) tuning a characteristic impedance of at least said first transmission line 110_1, b) impedance matching, e.g. for an RF amplifier 120, c) coordinated tuning of said characteristic impedance of at least said first transmission line and an operating point of said at least one active semiconductor device.

Further exemplary embodiments enable to provide a flexible tunable RF amplifier, supporting full flexibility on input matching network tuning, on output matching network tuning, as well as transistor bias tuning.

According to further exemplary embodiments, while the EC-material control voltages (CV1, CV2, may effect a changed characteristic impedance (cf. e.g. the Smith chart of FIG. 7A), a change in transistor biasing voltages VB may result in quiescent operation point OP movement in the transistor transfer characteristic, cf. FIG. 7B.

According to further exemplary embodiments, since input RF matching network 140a (FIG. 6) and RF output matching network 140b may have different impact on an overall amplifier performance, the following tuning may be achieved by the respective EC-based tunable RF matching line segments: EC-based RF matching line segment tuning on RF input matching may e.g. result in: impact on gain, impact on addressed frequency range, impact on supported bandwidth, whereas EC-based RF matching line segment tuning on RF output matching may e.g. result in: impact on addressed frequency range, impact on supported bandwidth, impact on output power, impact on efficiency, impact on linearity.

According to further exemplary embodiments, since the optima of gain, efficiency and output power may be at different impedances and may thus not be achieved simultaneously, the EC-based tunable matching networks 140a, 140b allows e.g. for application scenario specific amplifier tuning. If e.g. a maximum output power is currently required according to further exemplary embodiments, the matching networks 140a, 140b may be tuned for optimum output power. If at another instance e.g. less output power is required to support the application scenario, the matching networks 140a, 140b may be tuned for maximum amplifier efficiency, etc.

According to further exemplary embodiments, transistor bias tuning may e.g. impact: transistor output power, efficiency (e.g. class of operation), gain.

The invention claimed is:

1. An apparatus comprising:
a first transmission line for transmitting radio frequency signals; and
a radio frequency device comprising at least one active semiconductor device configured for processing radio frequency signals,
wherein said radio frequency device is coupled to said first transmission line, and wherein said first transmission line comprises an electro-chromic material comprising a permittivity which is controllable with applying a first control voltage to said first transmission line.

2. The apparatus according to claim 1, wherein said radio frequency device is at least one of: a) an amplifier, b) a transmitter, c) a receiver, d) a transceiver.

3. The apparatus according to claim 1, wherein said at least one active semiconductor device is a transistor.

4. The apparatus according to claim 1, wherein said apparatus comprises at least one further transmission line that comprises an electro-chromic material comprising a permittivity which is controllable with applying a further control voltage to said at least one further transmission line.

5. The apparatus according to claim 1, wherein said apparatus comprises a second transmission line, wherein said first transmission line is coupled to a first terminal of said at least one radio frequency device, and wherein said second transmission line is coupled to a second terminal of said at least one radio frequency device.

6. The apparatus according to claim 4, wherein at least one of said first transmission line and said at least one further transmission line comprises a first conductor, a second conductor, and said electro-chromic material arranged between said first conductor and said second conductor.

7. The apparatus according to claim 6, wherein at least one electrolyte layer is provided: a) between said first conductor and said electro-chromic material and/or b) between said second conductor and said electro-chromic material.

8. The apparatus according to claim 1, wherein said apparatus comprises a control device for at least temporarily applying at least one control voltage, being at least one of said first control voltage, and said further control voltage, to said electro-chromic material.

9. The apparatus according to claim 8, wherein said control device is configured to at least temporarily apply at least one bias voltage to at least one component of said at least one active semiconductor device.

10. The apparatus according to claim 1, wherein said apparatus comprises at least one impedance transformation network, wherein said first transmission line forms part of said at least one impedance transformation network.

11. The apparatus according to claim 1, wherein said apparatus comprises a first impedance transformation network coupled to the first terminal of said radio frequency device and a second impedance transformation network coupled to a or said second terminal of said radio frequency device.

12. The apparatus according to claim 11, wherein at least one of said first impedance transformation network and said second impedance transformation network comprises at least one transmission line which comprises an electro-chromic material comprising a permittivity which is controllable with applying a respective control voltage to said transmission line.

13. The apparatus according to claim 1, wherein at least one DC blocking capacitor or filter is provided: a) between said first transmission line and said at least one radio frequency device, and/or b), for said apparatus comprising at least two adjacent transmission lines, between said adjacent transmission lines.

14. The apparatus according to claim 9, wherein said control device is configured to at least temporarily coordinate an application of said at least one bias voltage to at least one component of said at least one active semiconductor device with an application of a or said control voltage to said electro-chromic material of at least said first transmission line.

15. A method of manufacturing an apparatus comprising a first transmission line for transmitting radio frequency signals and a radio frequency device comprising at least one active semiconductor device for processing radio frequency signals, comprising:
   providing said first transmission line, wherein said first transmission line comprises an electro-chromic material comprising a permittivity which is configured to be controlled with applying a first control voltage to said first transmission line; and
   coupling said radio frequency device to said first transmission line.

* * * * *